United States Patent [19]

Yamazaki

[11] Patent Number: 5,587,330
[45] Date of Patent: Dec. 24, 1996

[54] METHOD FOR MANUFACTURING SEMICONDUCTOR DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 544,636

[22] Filed: Oct. 18, 1995

[30] Foreign Application Priority Data

Oct. 20, 1994 [JP] Japan .................. 6-281406

[51] Int. Cl.$^6$ .............................. H01L 21/8234
[52] U.S. Cl. .................. 437/41; 437/21; 437/174; 437/247; 437/40; 148/DIG. 90; 148/DIG. 150
[58] Field of Search .............. 437/41, 40, 247, 437/21, 913, 173, 174; 148/DIG. 150, DIG. 90

[56] References Cited

U.S. PATENT DOCUMENTS

| | | | |
|---|---|---|---|
| 5,306,651 | 4/1994 | Masumo et al. | 437/173 |
| 5,387,546 | 2/1995 | Maeda et al. | 148/DIG. 90 |
| 5,395,804 | 3/1995 | Ueda | 437/40 |
| 5,403,762 | 4/1995 | Takemura | 437/41 |
| 5,424,230 | 6/1995 | Wakai | 437/247 |
| 5,523,257 | 6/1996 | Yamazaki et al. | 437/174 |

FOREIGN PATENT DOCUMENTS

| | | | |
|---|---|---|---|
| 1247686 | 11/1986 | Japan . | |
| 1187814 | 7/1989 | Japan | 148/DIG. 90 |
| 1246829 | 10/1989 | Japan . | |
| 4022127 | 1/1992 | Japan . | |

*Primary Examiner*—T. N. Quach
*Assistant Examiner*—Michael Trinh
*Attorney, Agent, or Firm*—Sixbey, Friedman, Leedom & Ferguson, P.C.; Gerald J. Ferguson, Jr.

[57] ABSTRACT

In producing a top gate type insulated gate semiconductor device in which a non-single crystalline semiconductor layer is used to form a channel forming region, after a gate electrode is formed on the non-single crystalline semiconductor layer through a gate insulating film, while ultraviolet light is irradiated to the non-single crystalline semiconductor layer, heating treatment is performed at a temperature of from 300° to 600° C. in an atmosphere containing nitrogen oxide or hydrogen nitride, in order to neutralize a recombination center in the non-single crystalline film or a boundary between the non-single crystalline film and the gate insulating film.

30 Claims, 8 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device formed on an insulating substrate (such as glass) or on an insulating film formed on a substrate of various kinds. The semiconductor device includes, for example, thin film transistors (TFT), thin film integrated circuits constructed of TFTs, and thin film integrated circuits for liquid crystal displays of active matrix type. More particularly, the present invention relates to a method for heat treatment to obtain a gate insulating film having good characteristics.

The present invention is applicable to an insulated gate field effect transistor of a top gate type having the gate electrode above the channel forming region in which at least part of the channel forming region under the gate insulating film is amorphous or polycrystalline (or non-single crystalline) semiconductor, or a single crystalline semiconductor.

2. Description of the Related Art

A recent development in the semiconductor industry is a semiconductor device having thin film transistors (TFTs) on an insulating substrate such as glass. Such a semiconductor device is used for an active type liquid crystal display and image sensors in which TFTs drive picture elements.

The TFTs used for these devices are usually made of silicon semiconductor thin film, which is amorphous or polycrystalline. The amorphous or polycrystalline silicon semiconductor is non-single crystalline semiconductor and has recombination centers due to dangling bonds or the like. Recombination centers are present not only inside the semiconductor but also at the interface between the semiconductor and the gate insulating film.

Recombination centers greatly affect the characteristics of TFT. That is, an insulating gate type field effect transistor of non-single crystalline silicon is inferior in mobility and subthreshold characteristics (S value) to an insulated gate type field effect transistor of single crystalline silicon. Also, the former suffers a large leakage current through the gate electrode. This leads to a marked decrease in ON current (due to deterioration and change with time) after use for a long period of time.

SUMMARY OF THE INVENTION

The object of the present invention is to improve the characteristics of TFTs to such an extent that they are comparable to those of single crystalline semiconductors, by neutralizing or extinguishing recombination centers in non-single crystalline silicon semiconductor.

The first aspect of the present invention is characterized by irradiating the semiconductor device with ultraviolet light having a wavelength of 350 nm or less through the upper side and/or lower side thereof, while heating at 300° to 650° C. in an atmosphere containing nitrogen oxide, after at least the gate electrode has been formed. The nitrogen oxide may be dinitrogen monoxide ($N_2O$), nitrogen monoxide (NO), nitrogen dioxide ($NO_2$), or any substance represented by the formula $NO_x$ ($0.5 < X < 2$).

In general, TFTs of top gate type are manufactured by the following steps.

(1) Formation of a non-single crystal semiconductor layer which becomes the channel forming region.

(2) Formation of the gate insulating film.

(3) Formation of the gate electrode.

(4) Formation of the interlayer insulator.

(5) Formation of the source/drain electrodes and interconnect (wiring).

The source/drain regions are formed before the process (4). In particular, the source/drain regions of self-alignment type are formed in an intermediate process between the processes (3) and (4).

In the present invention, the above nitrogen oxide neutralizes or extinguishes, through nitriding or oxidation, recombination centers present in the channel forming region of a non-single crystal silicon semiconductor or at the interface between the channel forming region and the gate insulating film. Such nitriding or oxidation should preferably be performed such that the concentration of nitrogen or oxygen in the silicon film increases by 0.1 atom % or more before and after the heat treatment.

In the present invention, the process of neutralizing or extinguishing recombination centers should be performed after the process (3) of the above five processes (1) to (5). Even if it is performed before the processes (3), the state of a channel forming region and a gate insulating film is changed at the formation of a gate electrode, so that recombination centers may be produced again. In particular, if the gate electrode is formed by sputtering or plasma CVD, recombination centers are liable to produce due to plasma-induced damage.

Once the gate electrode has been formed, the channel forming region and the interface between the channel forming region and the gate insulating film become extremely stable. Therefore, it is effective to neutralize or extinguish recombination centers after the gate electrode is formed. The later the process of neutralizing or extinguishing recombination centers is performed, the less the channel forming region and the interface between the channel forming region and the gate insulating film are liable to external changes and hence the smaller the possibility of recombination centers occurring in additional processes. A disadvantage of postponing the process of neutralizing or extinguishing recombination centers is that it becomes harder for nitrogen oxide to penetrate into a channel forming region or a gate insulating film, with the result that recombination centers are not effectively neutralized or extinguished.

In the present invention, irradiation with ultraviolet light effectively decomposes nitrogen oxide. The ultraviolet light should have a wavelength of 100 to 350 nm, preferably 150 to 300 nm. The duration of irradiation should preferably be 5 minutes to 2 hours, depending on temperature, intensity of ultraviolet light, and procedure.

In the processes, the substrate temperature may be raised or lowered at any rate determined by one who practices the present invention. From the view point of mass production, it is desirable to heat or cool the substrate at 5° to 30° C./minute. Heating or cooling may be performed in an atmosphere of nitrogen.

The second aspect of the present invention is characterized by irradiating the semiconductor device with ultraviolet light having a wavelength of 350 nm or less through the upper side and/or lower side thereof, while heating at 300° to 650° C. in an atmosphere containing nitrogen hydride, after the gate electrode is formed. The nitrogen hydride may be ammonia ($NH_3$), hydrazine ($N_2H_4$), or any substance represented by the formula $NH_x$ ($1 < X < 3$).

In the present invention, the above nitrogen hydride neutralizes or extinguishes, through nitriding or hydrogenation, recombination centers present in the channel forming region of a non-single crystalline silicon semiconductor or at the interface between the channel forming region and the gate insulating film. Such nitriding or hydrogenation should preferably be performed such that the concentration of nitrogen in the silicon film increases by 0.1 atom % or more before and after the heat treatment. Once neutralized with hydrogen, recombination centers are unstable and liable to decomposition, and hence their density should be low. In other words, it is desirable to neutralize recombination centers mainly with nitrogen. To this end, the heat treatment should be performed at 400° C. or higher. At 400° C. or higher, hydrogen easily separates from silicon and hence recombination centers neutralized with nitrogen selectively remain.

The upper limit of the heat treatment temperature may be the strain point of the glass substrate or lower when the glass substrate is used. This option is desirable to prevent the thermal strain and deformation of the temperature-sensitive glass substrate.

According to the second aspect of the present invention (as in the first aspect of the present invention), the process of neutralizing or extinguishing recombination centers should be performed after the process (3) in the processes of manufacturing a top gate type TFTs. The later the process is performed, the less effective is.

In the present invention, the decomposition of nitrogen hydride is promoted by irradiation with ultraviolet light. It is possible to combine the first aspect and the second aspect of the present invention, so that the above heat treatment is performed in an atmosphere containing both nitrogen oxide and nitrogen hydride. This practice produces a synergistic effect. Since nitrogen oxide is strongly oxidative and nitrogen hydride is strongly reductive, a mixture of both brings about the oxidation reduction reaction, thereby to obtain water and chemically active nitrogen. This active nitrogen effectively neutralizes recombination centers.

Irradiation with ultraviolet light in an atmosphere containing nitrogen oxide and/or nitrogen hydride neutralizes or extinguishes recombination centers in the channel forming region or at the interface of the gate insulating film and the channel forming region. As the result, TFTs of polycrystalline silicon semiconductor have the same characteristics as those of single crystal silicon semiconductor.

DESCRIPTION OF THE PREFERRED EMBODIMENTS

EXAMPLE 1

FIGS. 7A to 7E shows the steps of producing a thin film transistor (TFT) of top gate type. The TFT in this example has a source/drain formed by the self-alignment. The process for producing the TFT includes the following major five steps. There may be additional minor steps.

Figure 7A:
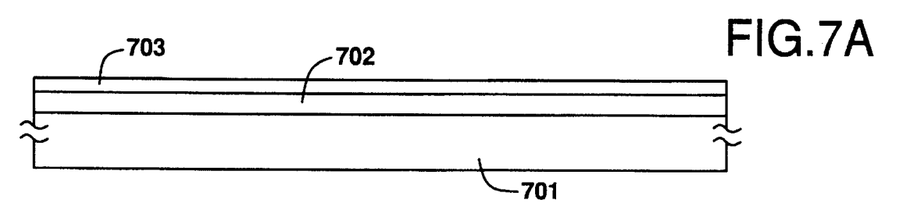
FIGS. 7A to 7E show the steps of producing a thin film transistor (TFT) in Example 1.

(1) Step of depositing a silicon film on the substrate, as shown in FIG. 7A.

Figure 7B:
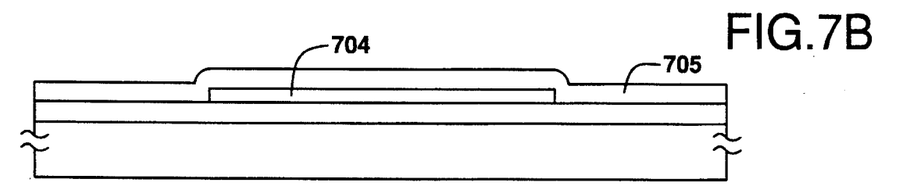

(2) Step of depositing a gate insulating film on the silicon film, as shown in FIG. 7B.

Figure 7C:
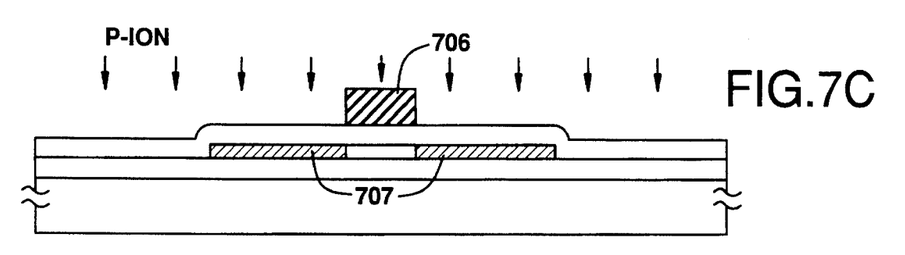

(3) Step of forming a gate electrode and forming a source/drain using it as a mask by the self-alignment, as shown in FIG. 7C.

Figure 7D:
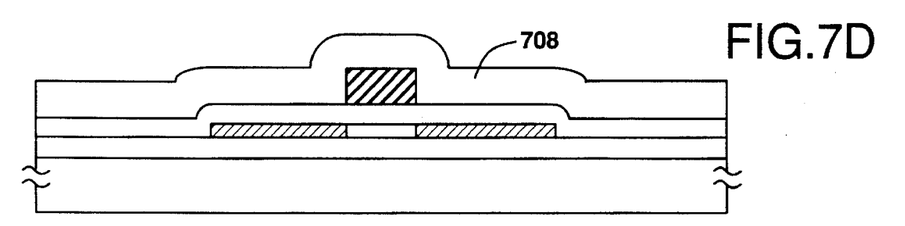

(4) Step of forming an interlayer insulator, as shown in FIG. 7D.

Figure 7E:
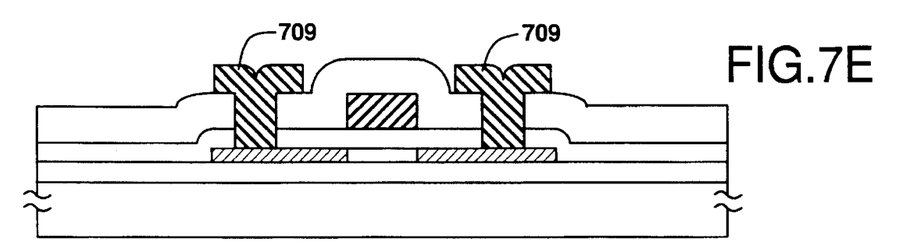

(5) Step of etching the interlayer insulator to form contact holes and then forming electrodes and interconnects (wirings) for the source/drain, as shown in FIG. 7E. In this example, a glass substrate is used, which may be either Corning 7059 glass substrate (with a strain point of 593° C.) or Corning 1737 glass substrate (with a strain point of 667° C.).

The detail description of each step follows. A silicon oxide film 702 (1000 to 5000 Å thick) is formed as a base film on a substrate 701 by plasma chemical vapor deposition (CVD) or sputtering. On the silicon oxide film 702 is formed an amorphous silicon film (100 to 2000 Å thick, preferably 400 to 1000 Å thick) by plasma CVD or low pressure CVD. The amorphous silicon film is crystallized by heat treatment in an atmosphere of nitrogen, to obtain a polycrystalline silicon film 703. A trace amount of element (such as nickel) which promotes the crystallization of amorphous silicon may be added to the amorphous silicon film. Moreover, the polycrystalline silicon film 703 may be irradiated with intense light such as laser light to improve its crystallinity. Incidentally, the heat treatment for crystallization may be replaced by light annealing (which involves irradiation with laser light) In stead of amorphous silicon film, a single crystalline silicon film may be used. (See FIG. 7A.)

Then, the crystallized silicon film 703 is etched, so that an island-like region 704 is formed. The island-like region 704 is an active layer of TFT in which the channel forming region is formed. On the island-like region 704 is formed a silicon oxide film 705 (1000 Å thick) as a gate insulating film. In this example, the silicon oxide film 705 is formed by any of the following three different methods. (See FIG. 7B.)

The first method is plasma CVD using dinitrogen monoxide (or oxygen) and monosilane ($SiH_4$) as raw gases introduced into a chamber equipped with parallel plate type electrodes. Radio frequency (RF) electric power (with a frequency of 13.56 MHz) is applied to produce plasma. The substrate temperature is 350° to 500° C., preferably 380° to 450° C. In this example, the reaction pressure is 4 Pa, the provided power is 150 W, and the substrate temperature is 430° C.

The second method is sputtering using synthetic quartz as a target. Sputtering is performed to form a film in an atmosphere of 100% oxygen at 1 Pa. The provided power is 350 W and the substrate temperature is 200° C.

The third method is ECR(electron cyclotron resonance)-CVD using monosilane ($SiH_4$) and oxygen as raw gases.

Oxygen may be replaced by nitrogen oxide such as $N_2O$, NO, and $NO_2$. In this example, the substrate is not heated and the provided power for microwave (2.45 MHz) is 400 W.

On the silicon oxide film 705 is formed a film by a material such as polycrystalline silicon, aluminum, tantalum, molybdenum, and tungsten. This film is etched to form a gate electrode and its interconnect (wiring). In this example, a polycrystalline silicon film (1000 to 6000 Å thick) containing 1 to 2% phosphorus is formed by low pressure CVD and then etched to form the gate electrode 706.

The gate electrode 706 may be formed by aluminum containing a small amount (about 0.1 to 1 weight %) of scandium (Sc) or zirconium (Zr). Aluminum is effective to reduce the resistance of the gate electrode 706 and its wiring. The heating temperature for aluminum should be 450° C. or lower because of low heat resistance in aluminum.

The island-like silicon film 704 is doped with an impurity (phosphorus in this example) by the ion doping using the gate electrode 706 as a mask for the self-alignment. The dose is $1\times10^{14}$ to $5\times10^{15}$ atoms/cm$^2$, and the accelerating voltage is 10 to 90 kV. In this example, the dose is $1\times10^{15}$ atoms/cm$^2$ and the accelerating voltage is 80 kV. As the result, N-type impurity regions (or source/drain) 707 are formed. (See FIG. 7C)

Figure 1A:
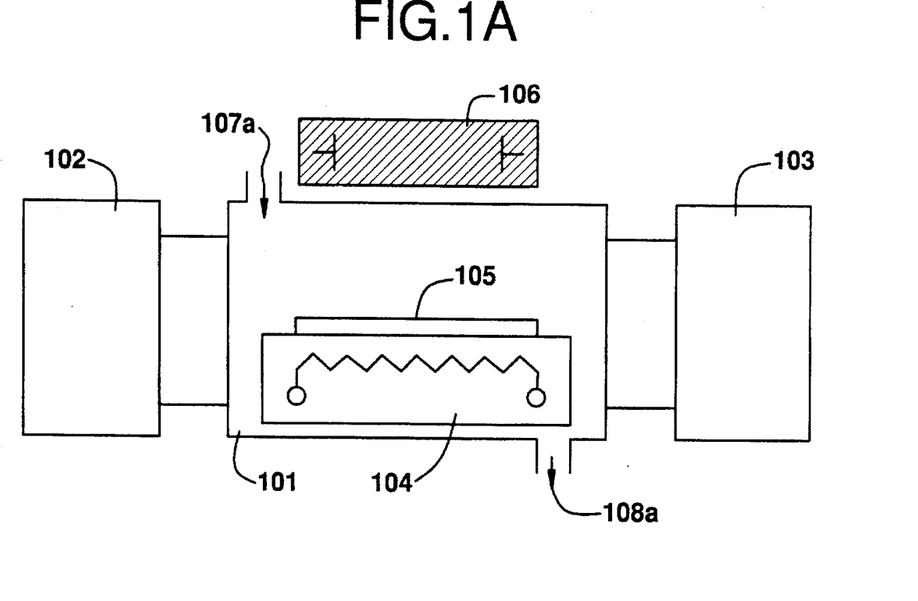
FIGS. 1A and 1B show the heat treatment apparatus used in Example 1.
Figure 1B:
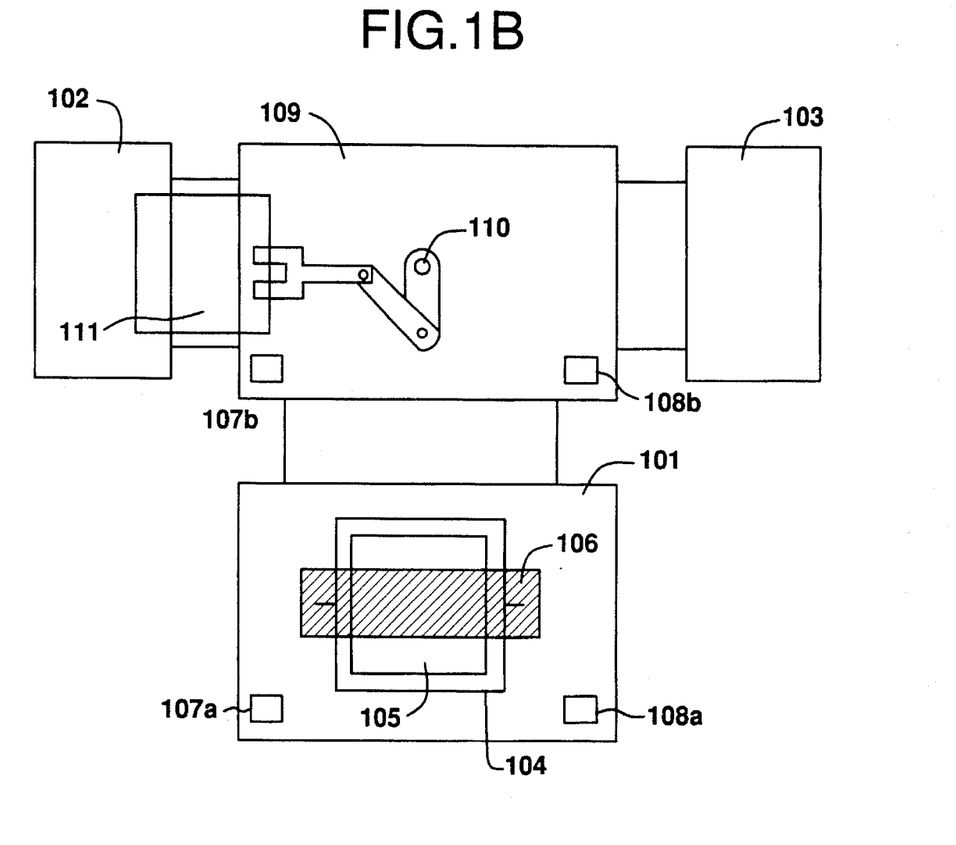

Then, heat treatment is performed in an atmosphere of $N_2O$ by the heat treatment apparatus of FIGS. 1A and 1B. The heat treatment apparatus used in this example has a chamber 101 for heat treatment, a store room 102 for storing untreated substrates, a store room 103 for storing treated substrates, and a foreroom 109 equipped with a conveyor (transporter) 110. A substrate 111 is transferred from one room to another by the conveyor 110. In this example, the apparatus is designed as a single wafer type such that the substrate is treated one by one in a chamber 101.

The chamber 101 has a substrate holder 104 provided with a heater to heat a substrate 105. Outside the chamber 101, a ultraviolet light source 106 is provided. In this example, the ultraviolet light source 106 is a low pressure mercury lamp (with center wavelengths of 246 nm and 185 nm). In a portion in which the ultraviolet light source 106 is arranged and which is provided on the chamber 101, a window made of a material (such as quartz) transparent to ultraviolet light is provided. Although the ultraviolet light source 106 is placed on the chamber 101, it may be placed inside the chamber 101. The irradiation intensity is preferably between 7 mW/cm$^2$ to 15 mW/cm$^2$. A mercury lamp with center wavelengths of 254 nm may be used.

The chamber 101 and the foreroom 109 are provided with gas exhaust systems 108a for gas exhaust and 108b and gas introducing systems 107a and 107b for introducing gases.

A cassette holding several untreated substrates is placed in the store room 102. The substrate is transferred to the foreroom 109 by the conveyor 110. The foreroom 109 is exhausted through the gas exhaust system 108 to place the foreroom 109 at a low pressure. The substrate is transferred to the chamber 101 which had already been placed at a low pressure, and set on the substrate holder 104.

The chamber 101 is filled with $N_2O$ (at atmospheric pressure) through the gas introducing system 107a, so that a pressure in the chamber 101 is set to be an atmospheric pressure. The substrate is heat-treated in an atmosphere of substantially 100% $N_2O$ while ultraviolet light is irradiated from the ultraviolet light source 106. The temperature for heat treatment is 350° C. to 650° C., for example, 550° C.

The duration of heat treatment is 30 minutes to 6 hours, for example, 3 hours.

After heat treatment, the treated substrate is returned to the foreroom 109 by the conveyor 110. The treated substrate is set in a cassette placed in the store room 103. In this way the treatment of one substrate is completed, and the same procedure is repeated for the remaining substrates.

The heat treatment also produces an effect of activating the ion-doped phosphorus. For comparison, heat treatment is performed using the apparatus of FIGS. 1A and 1B, wherein dinitrogen monoxide is replaced by nitrogen ($N_2$).

A silicon oxide film (2000 Å–2 µm thick) as an interlayer insulating film 708 is formed by plasma CVD. (See FIG. 7D.)

The interlayer insulating film 708 and the gate insulating film 705 are etched, so that contact holes are formed in the source/drain 707. Then, an aluminum film is formed by sputtering and patterned to form source/drain electrodes 709.

It is desirable to add a trace amount of silicon or iron to the aluminum film when the source/drain electrodes 709 are formed. Such elements prevent generation of hillocks due to the anomalous growth of aluminum in the final process of heat treatment in hydrogen.

The heat treatment at 350° C. in an atmosphere of hydrogen completes an N-channel type TFT.

In this example, six kinds of samples are produced in which the gate insulating film 705 is formed in different manners and the heat treatment is performed in different manners. As a result, the characteristics of TFT are improved depending on the method of heat treatment. For example, the drain current (or leakage current) varies as follows, wherein the voltage $V_G$ of the gate electrode 706 is $-10$ V, the voltage of the source is 0 V, and the voltage of the drain is $+10$ V.

| Sample No. | Gate insulating film forming method | Atmosphere in heat treatment | Drain current |
| --- | --- | --- | --- |
| A-1 | Plasma CVD | $N_2O$ | 3.5 pA |
| A-2 | Plasma CVD | $N_2$ | 250.6 pA |
| B-1 | Sputtering | $N_2O$ | 2.6 pA |
| B-2 | Sputtering | $N_2$ | 82.5 pA |
| C-1 | ECR-CVD | $N_2O$ | 1.8 pA |
| C-2 | ECR-CVD | $N_2$ | 121.6 pA |

It is apparent from the table above that those samples heat-treated in an atmosphere of $N_2O$ together with ultraviolet light irradiation according to the present invention have an extremely low leakage current. They also have other improved characteristics. It is also found that the characteristics is not improved if heat treatment is performed without ultraviolet light irradiation.

Figure 3:
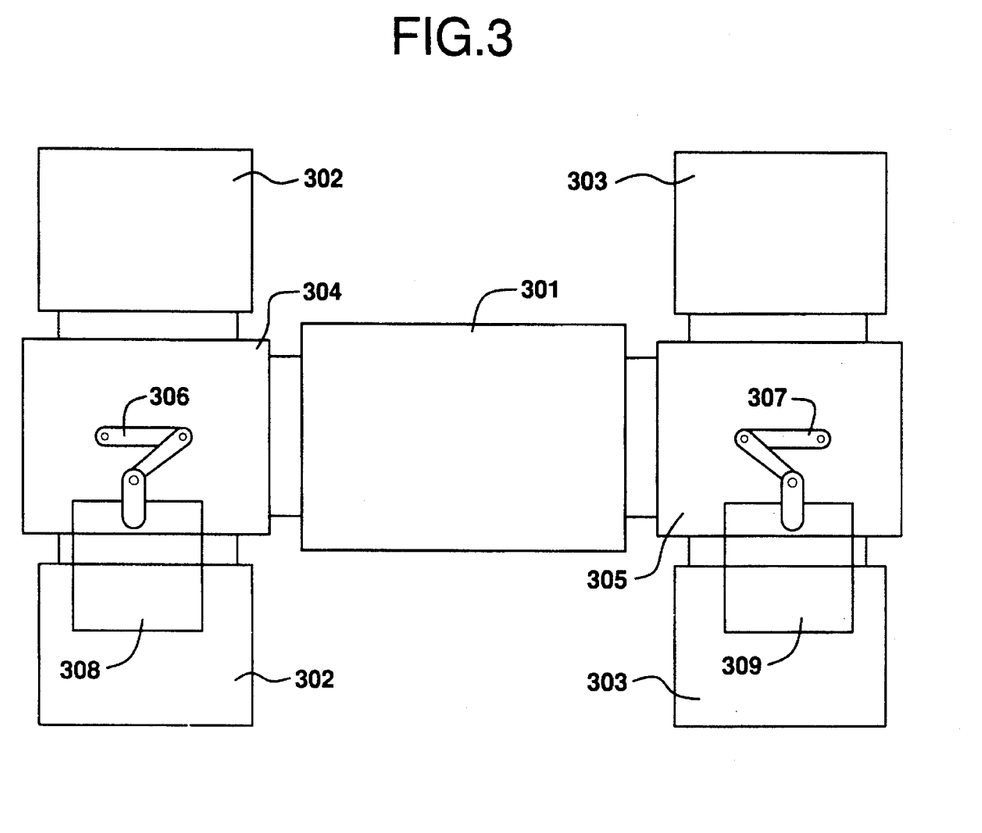
FIG. 3 shows the heat treatment apparatus used in Example 1.
Figure 4A:
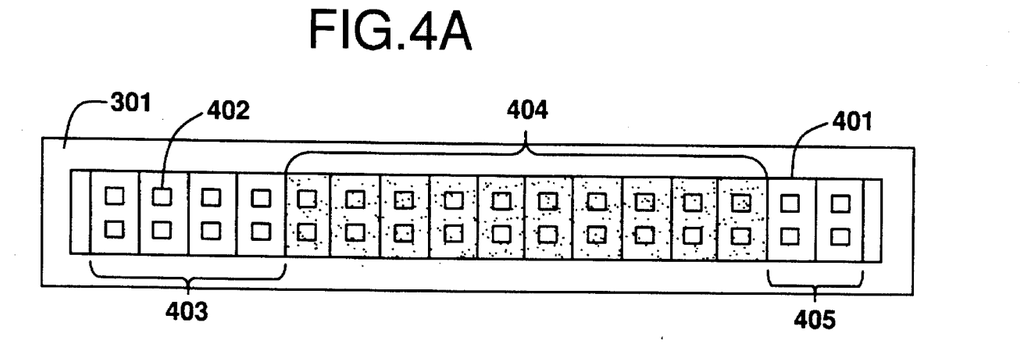
FIGS. 4A to 4C show the internal structure of the chamber of the heat treatment apparatus of FIG. 3 and also is a temperature gradient graph at heating.
Figure 4B:
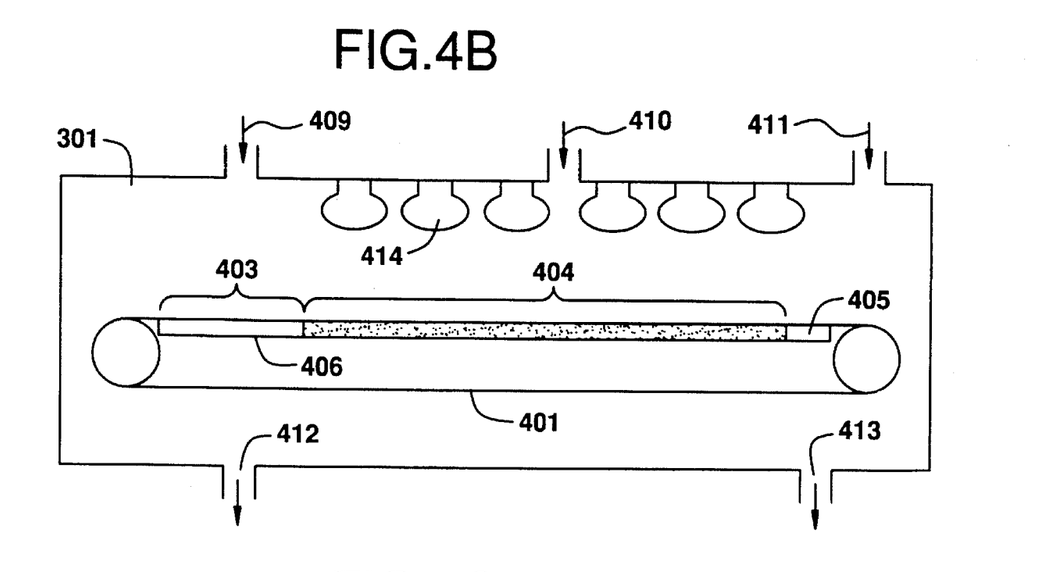
Figure 4C:
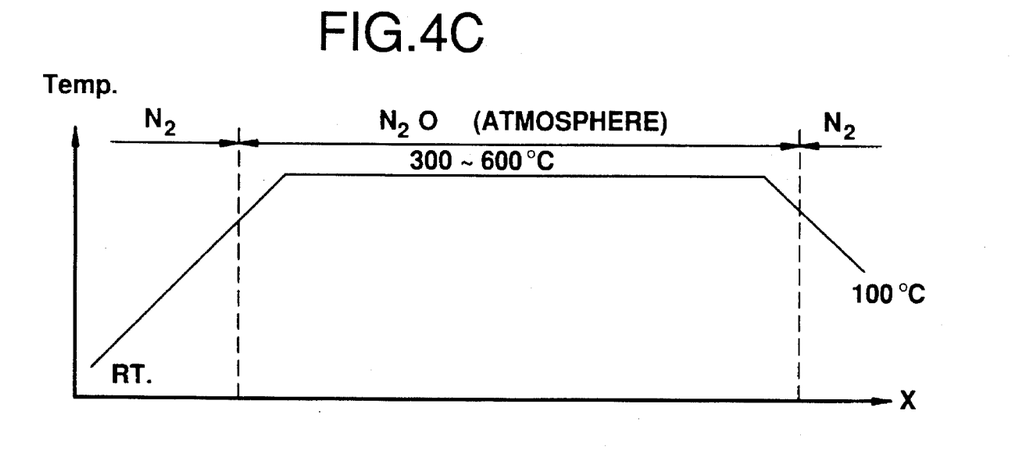

In this example, it is also possible to perform heat treatment using the apparatus shown in FIGS. 3 and 4. This apparatus permits efficient heat treatment without the necessity of changing other manufacturing conditions.

The apparatus of FIG. 3 has a chamber 301 for heat treatment, a store room 302 for storing untreated substrates, a store room 303 for storing treated substrates, and a foreroom 304 and 305 equipped with transporters 306 and 307. The substrates 308 and 309 are transferred among these rooms by the transporters 306 and 307. The chamber is a batch type and capable of heat-treating on a plurality of substrates which are transferred all at once by a conveyor.

FIGS. 4A and 4B show the internal structure of the chamber 301. The chamber 301 is equipped with a conveyor 401 made of heat resistant metal which permits heat treatment while substrates are transferred. Under the conveyor 401, a heater 406 for heating substrates 402 is provided. Substrates transferred by the conveyor 401 are heated at a desired increase rate by the heater 406 in a zone 403, kept at a desired temperature in a zone 404, and cooled in a zone 405.

The ceiling of the chamber 301 is equipped with ultraviolet light sources 414 for irradiating ultraviolet light to substrates in the zone 404 of the conveyor 401. In this example, the ultraviolet light source 414 is a low pressure mercury lamp with center wavelengths of 246 nm and 185 nm.

The chamber 301 is also equipped with gas introducing systems 409, 410, and 411 and gas exhaust systems 412 and 413. In the zones 403 and 405 for heating and cooling, an atmosphere of $N_2$ is introduced. In the zone 404 for heating at a constant temperature while irradiating ultraviolet, an atmosphere of $N_2O$ is introduced. The gas introducing systems are arranged in the zones, respectively. The gas exhaust systems 412, 413 are arranged close to each boundary of the zones. This arrangement prevents $N_2$ gas and $N_2O$ gas from being mixed in each zone 403, 404, or 405.

The procedure is explained below. A plurality of untreated substrates are placed in a cassette and then placed in the store room 302. (The apparatus used in this example has two units each of the store rooms so that untreated substrates are fed and treated substrates are changed continuously for efficient operation.) The untreated substrates are transferred to the foreroom 304 by the transporter 306 and then transferred to the chamber 301 for heat treatment and placed on the conveyor 401. Two substrates 402 are placed side by side on the conveyor 401.

The procedure for heat treatment is explained below. A temperature gradient in the conveyor 401 is shown in FIG. 4C. The substrates are heated in the heating zone 403 at a 5° to 30° C./minute, for example, 10° C./minute, from a room temperature (RT.). The heating zone 403 is in an atmosphere of $N_2$ introduced from the gas introducing system 409.

Then, the substrates are transferred to the zone 404 for heating at a constant temperature. In the zone 404, the heat treatment is performed while irradiating ultraviolet light from the ultraviolet light source arranged above the conveyor. The heating temperature is 500° to 650° C., for example, 550° C. The zone 404 is in an atmosphere of $N_2O$ introduced from the gas introducing system 410. The zone 404 has a size enough to permit 20 substrates to be treated all at once. The conveyor 401 is moved at such a speed that each substrate takes 30 minutes to 6 hours, for example, 3 hours to pass through the zone 404 for heat treatment.

The heat treatment is followed by cooling down to 250° C. in the cooling zone 405. The cooling rate is 5° to 30° C./minute, for example, 10° C./minute, which equals the heating rate. The cooling zone is in an atmosphere of $N_2$ introduced from the gas introducing system 411.

The treated substrates are transferred to the foreroom 305 by a transporter 307. Finally, the treated substrates are placed in a cassette in the store room 303. In this way the treatment of substrates is completed.

Treatment by the apparatus of FIGS. 1A and 1B takes about 4 hours for each substrate, whereas treatment by the apparatus of FIGS. 3 and 4 takes only ten and several minutes for each substrate, thereby to improve productivity.

Figure 5:
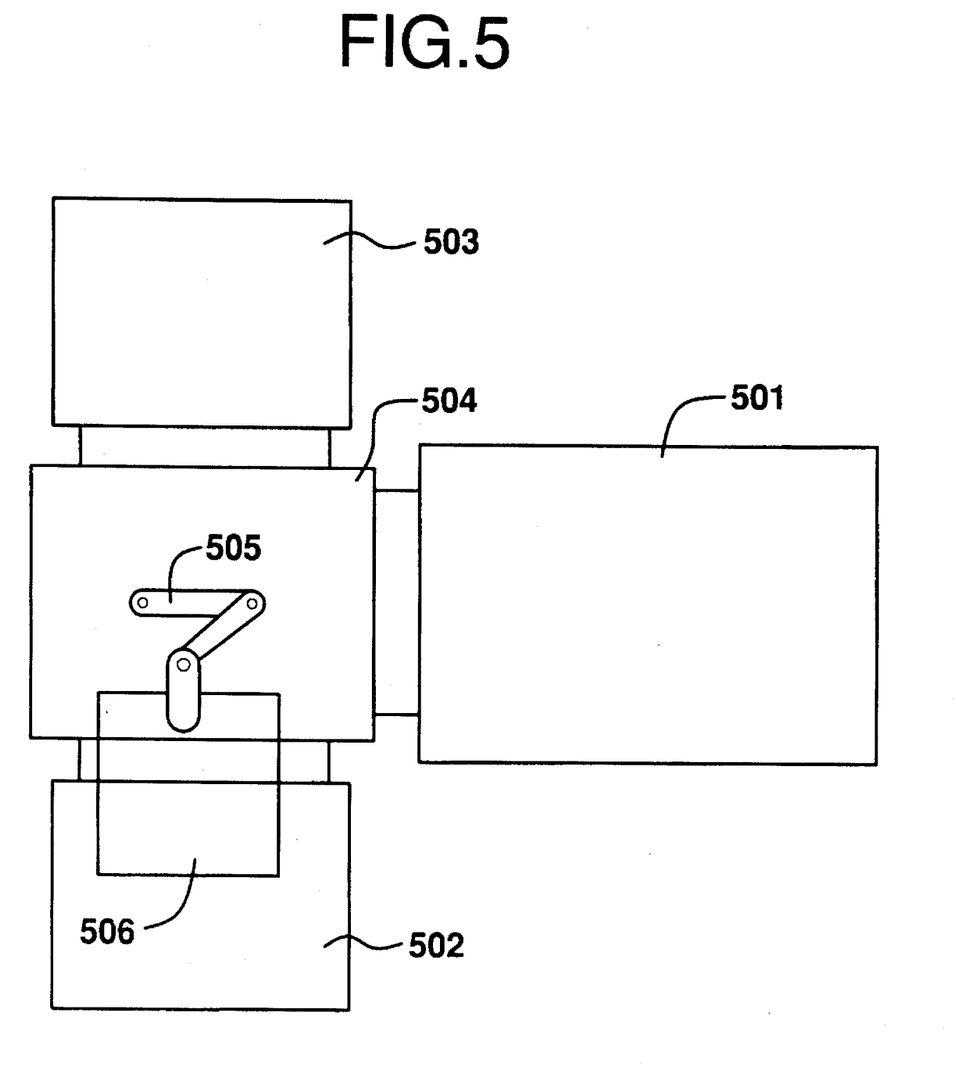
FIG. 5 shows the heat treatment apparatus used in Example 1.
Figure 6A:
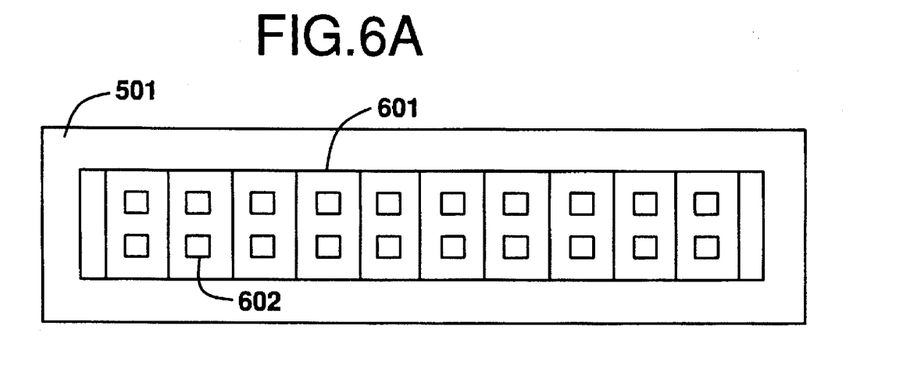
FIGS. 6A to 6C show the internal structure of the chamber of the heat treatment apparatus of FIG. 5 and also is a temperature gradient graph at heating.
Figure 6B:
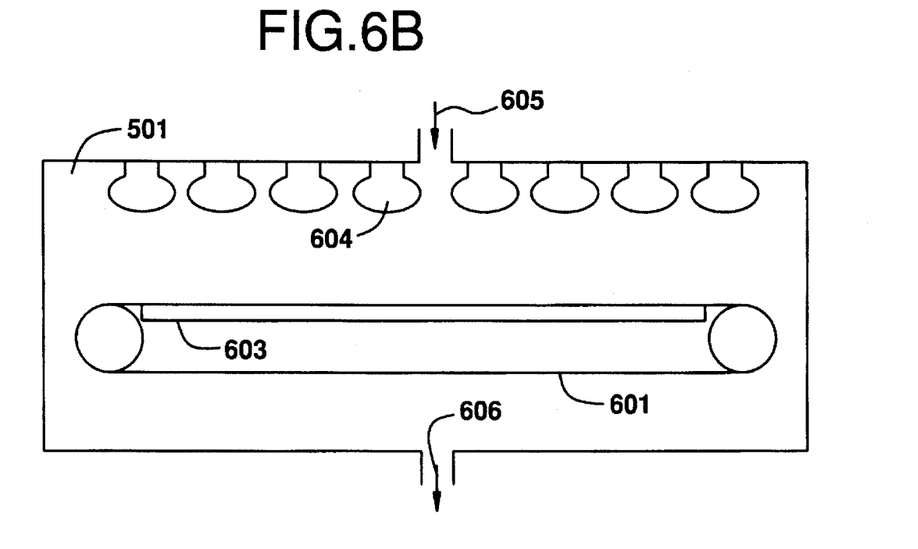
Figure 6C:
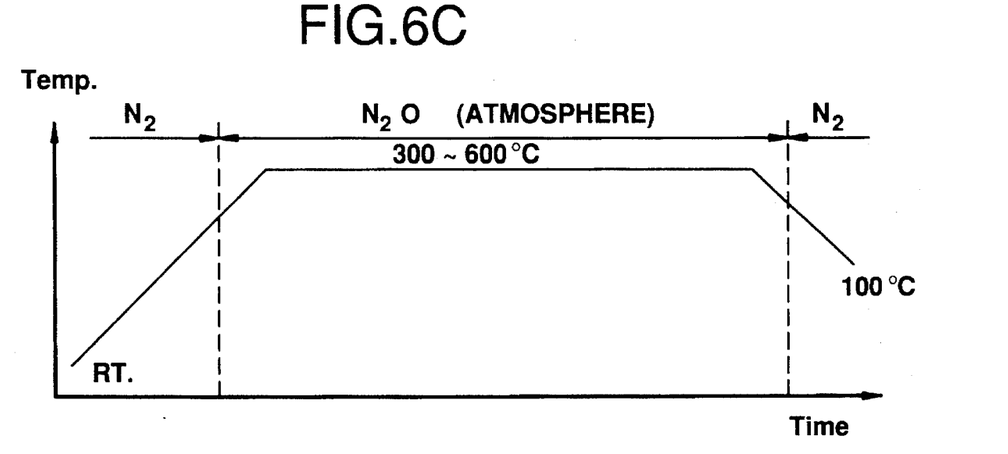

The same heat treatment as above may be performed using the apparatus shown in FIGS. 5 and 6. The apparatus of FIG. 5 has a chamber 501 for heat treatment, a store room 502 for storing untreated substrates, a store room 503 for storing treated substrates, and a foreroom 504 equipped with a transporter 505. A substrate 506 is transferred among these rooms by the transporter 505. In this example, the chamber 501 permits heat treatment to be performed on a plurality of substrates transferred by the conveyor 601.

FIGS. 6A and 6B show the internal structure of the chamber 501. The chamber 501 is equipped with a conveyor 601 made of heat resistant metal on which substrates 602 are placed. Under the conveyor 601 is provided a heater 603 to heat the substrates. Above the conveyor 601 is arranged a ultraviolet light source 604. In this example, the ultraviolet light source 604 is a low pressure mercury lamp (with center wavelengths of 246 nm and 185 nm).

The chamber 501 is equipped with a gas introducing system 605 through which $N_2$ is introduced when the substrate is heated and cooled or $N_2O$ is introduced when the substrate is heated at a constant temperature. The chamber 501 is also provided with a gas exhaust system 606 through which the introduced gas is exhausted. On the ceiling of the chamber are arranged the ultraviolet light sources 605 for irradiation of substrates with ultraviolet light.

The procedure is explained. A plurality of untreated substrates are placed in a cassette and the cassette is placed in the store room 502. The untreated substrates are transferred to the foreroom 504 by the transporter 505 and then transferred to the chamber 501, so that the substrates are placed on the conveyor 601. The substrates are arranged in two lines on the conveyor, and the conveyor is stopped when 20 substrates are placed on the conveyor.

The temperature in the chamber is changed with time during heating treatment as shown in FIG. 6C. The heating rate is 5° to 30° C./minute, for example, 10° C./minute, from a room temperature (RT.). During the heating stage, $N_2$ is introduced into the chamber through the gas introducing system 605.

When a desired temperature for heat treatment is reached, the substrates are irradiated with ultraviolet light from the ultraviolet light source 604. The heating temperature is 500° to 650° C., for example, 550° C. Immediately before the temperature for heating treatment reaches, $N_2O$ gas is introduced through the gas introducing system 605, so that the atmosphere in the chamber may be completely replaced by $N_2O$ when heat treatment is performed. The duration of heat treatment is 30 minutes to 6 hours, for example, 4 hours.

After heat treatment, the substrates are cooled to 250° C. The cooling rate is 5° to 30° C./minute, for example, 10° C./minute, which equals the heating rate. Cooling is performed in an atmosphere of $N_2$ which is introduced into the chamber through the gas introducing system 605.

The treated substrates are transferred to the foreroom 504 by the transporter 505. Finally, the treated substrates are placed in a cassette in the store room 503. In this way the treatment of substrates is completed.

EXAMPLE 2

This example is a method for producing a TFT as shown in FIGS. 8A to 8E. The process in this example involves heat treatment using the apparatus of FIGS. 2A and 2B. The heat treatment apparatus in this example differs from that (single wafer type) in Example 1. It includes only a chamber for heat treatment, so that it permits heat treatment of a plurality of substrates at one time as a batch type. In this example, four kinds of samples are prepared to perform heat treatment in differ stages. The samples are designated as P, Q, R, and S, each having 10 pieces. The process of producing a TFT using this apparatus is explained.

Figure 8A:
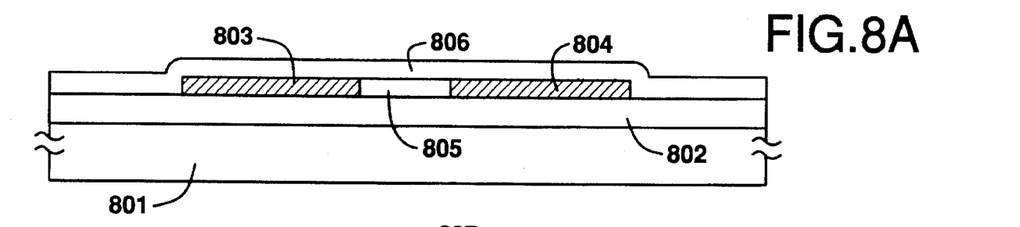
FIGS. 8A to 8E show the steps of producing a TFT in Example 2.
Figure 8B:
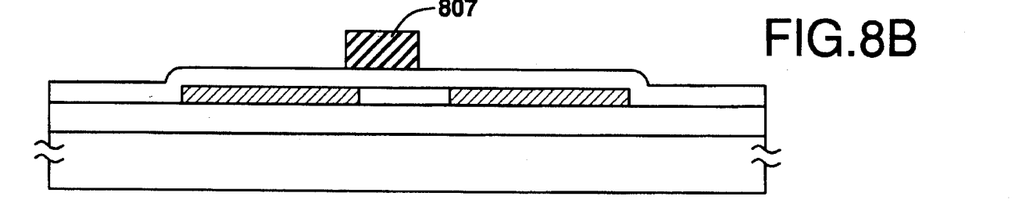

A base silicon oxide film 802 and an amorphous silicon film are formed on a substrate 801. The amorphous silicon film is doped with an N-type impurity (phosphorus) by ion doping. The doped impurity region is activated by irradiating KrF excimer laser light (with a wavelength of 248 nm and a pulse width of 20 ns). The energy density of the laser is 200 to 400 mJ/cm$^2$, preferably 250 to 350 mJ/cm$^2$.

The silicon film is etched at an island-like pattern to obtain an active layer having a source 803, a drain 804, and a channel forming region 805. On the active layer is formed a silicon oxide film 806 as a gate insulating film by plasma CVD. (See FIG. 8A.)

A 5000 Å thick aluminum film containing 1 weight % silicon or 0.1 to 0.5 weight % scandium) is formed by sputtering and then etched to form a gate electrode 807. The gate electrode 807 is positioned away from the drain 804. (See FIG. 8B).

Figure 8C:
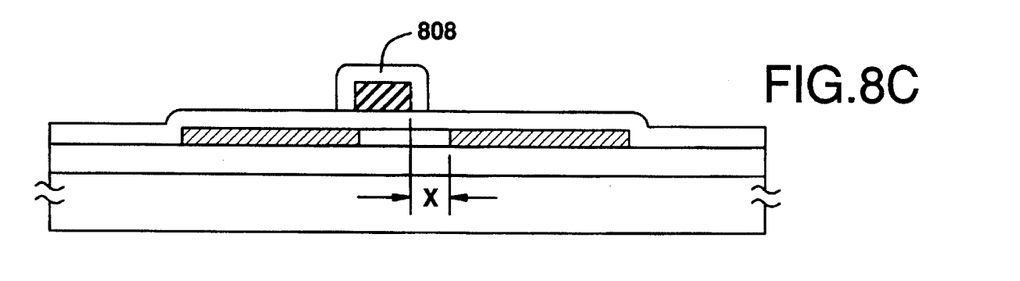
Figure 8D:
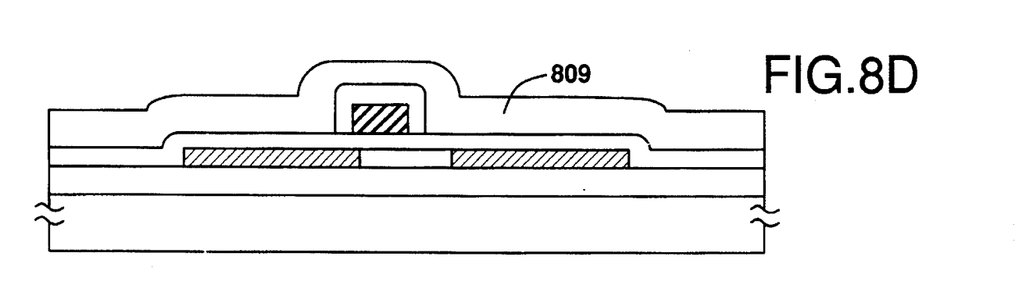
Figure 8E:
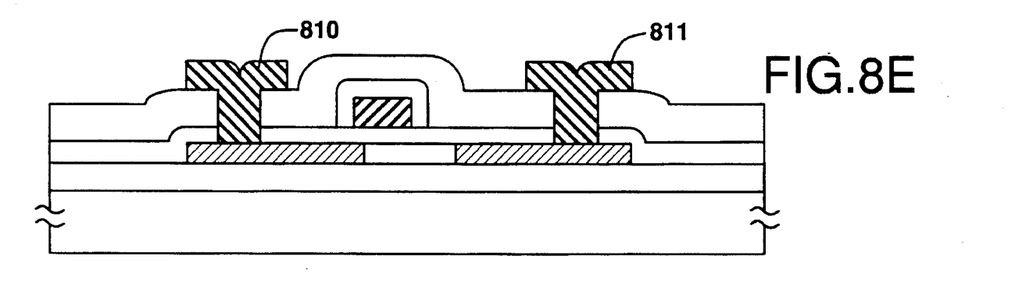

The processed substrate is anodized in an ethylene glycol solution (adjusted to =pH 7) containing 1 to 3% tartaric acid, wherein the cathode is platinum and the anode is the aluminum gate electrode 807. Anodization is performed in such a manner that the voltage is increased to 120 V at a constant current and then this voltage is maintained for 1 hour. Thus a 1500 Å thick anodic oxide 808 is formed, to protect the gate electrode 807 from damage in the subsequent heat treatment.

In FIG. 8C, the gate electrode 807 is positioned by a distance x away from the drain 804, it is an offset state. This offset state is known to be effective in reducing the leakage current of the drain 804.

Figure 2A:
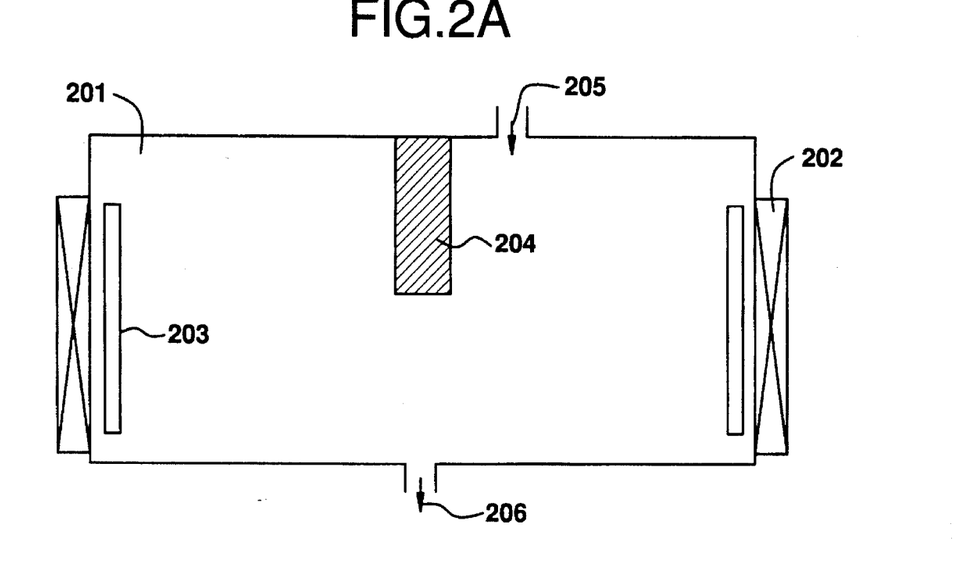
FIGS. 2A and 2B show the heat treatment apparatus used in Example 2.
Figure 2B:
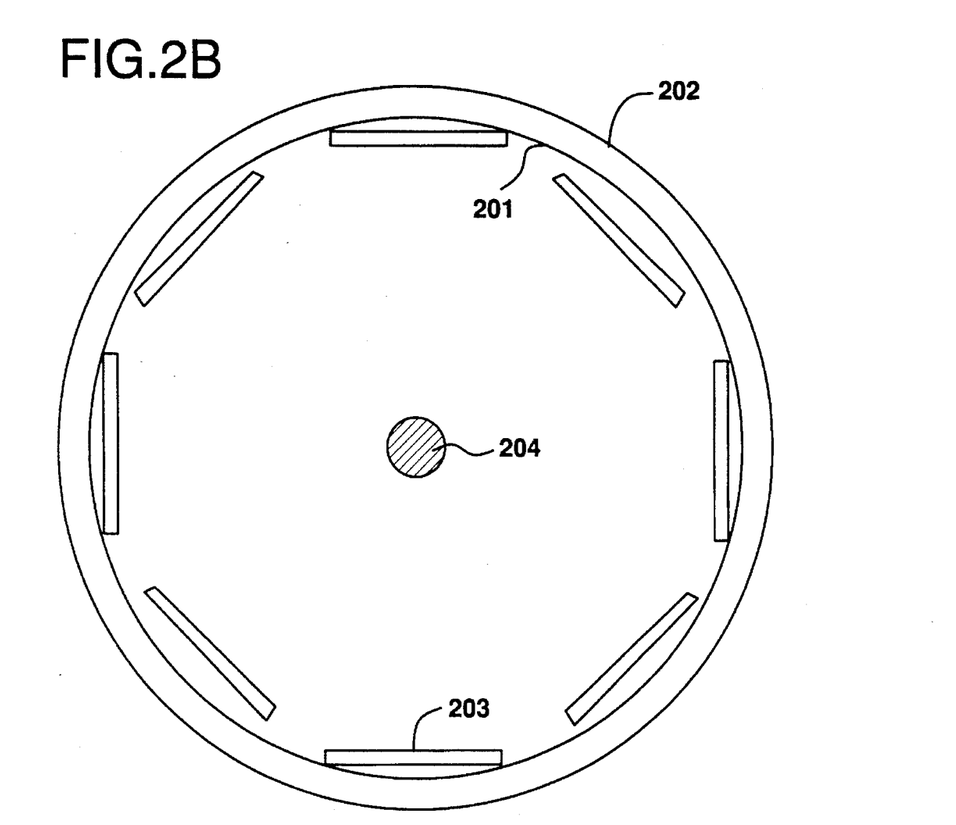

Heat treatment is performed on samples P using the apparatus of FIG. 2A and 2B. This apparatus has a cylindrical chamber 201 which is designed such that substrates 203 are arranged on its inner wall and heated by heaters 202 provided in the periphery of the chamber 201. At the center of the chamber 201 is arranged a ultraviolet light source 204, so that the substrates are uniformly irradiated with ultraviolet light. In this example, the ultraviolet light source is a low pressure mercury lamp with center wavelengths of 246 nm and 185 nm.

The chamber 201 is equipped with a gas introducing system 205 and a gas exhaust system 206. On the outside of the chamber 201, heaters 202 are arranged.

The process of heat treatment using this apparatus is explained below. The substrates 203 are arranged on the inner wall of the chamber 201 such that they surround the ultraviolet light source 204. In the chamber 201, $N_2$ is introduced through the gas introducing system 205 to replace an atmosphere in the chamber into $N_2$. In this state, $N_2$ introduced is exhausted through the gas exhaust system 206 so that the pressure in the chamber 201 is kept constant.

When the atmosphere in the chamber 201 is completely replaced by $N_2$, heating is performed by the heaters 202 and ultraviolet light is irradiated by the ultraviolet light source 204. The heating temperature is 300° to 700° C., for example, 450° C.

When the substrates are heated to a desired temperature, the atmosphere in the chamber 201 is replaced from $N_2$ to $NH_3$ and then the substrates are irradiated with ultraviolet light from the ultraviolet light source 204. The heat treatment is performed for 30 minutes to 6 hours, for example, 4 hours.

Subsequently, a 6000 Å thick interlayer insulator 809 is deposited by plasma CVD. (See FIG. 8D)

Samples Q are heat-treated using the apparatus of FIGS. 2A and 2B under the same conditions as used for samples P.

Finally, the interlayer insulator 809 and the gate insulating film 806 are etched to form contact holes. A source electrode 810 and a drain electrode 811 are formed from a multilayer metal film composed of titanium (500 Å), aluminum (5000 Å), and titanium (500 Å). (See FIG. 8E)

Samples R are heat-treated under the same conditions as for samples P and Q using the apparatus of FIGS. 2A and 2B. Samples S are not heat-treated using the apparatus of FIGS. 2A and 2B. The resulting heat-treated samples are tested for drain current (leakage current) under the same conditions as in Example 1. The results (average value of 10 specimens) are shown below.

| Sample | Heat treatment in $NH_3$ atmosphere | Drain current |
|---|---|---|
| P | Between formation of gate electrode and formation of interlayer insulator | 0.8 pA |
| Q | Between foriration of interlayer insulator and formation of source/drain electrodes | 2.3 pA |
| R | After formation of source/drain electrodes | 2.1 pA |
| S | Without heat treatment | 112.5 pA |

It is possible to reduce the leakage current in the case of offset gate structure; however, this effect is extremely limited if the channel forming region is formed from polycrystalline silicon in which the crystallinity is insufficient. The process of the present invention eliminates this disadvantage because it neutralizes and extinguishes recombination centers in the channel forming region. The resulting semiconductor device has characteristic properties comparable to those of the semiconductor device manufactured from single crystal silicon. In addition, it is found that the process of the present invention improves the reduction of leakage current.

Although the explanation in Examples 1 and 2 is about experiments in which polycrystalline silicon is used as a semiconductor, the process of the present invention may be applied to any amorphous material or any material which is almost equivalent to a single crystal material but has many recombination centers. In addition, the process of the present invention may be applied to germanium and compound semiconductors (such as GaP, GaAs, GaAlAs, SiC, and BP) as well as silicon semiconductor.

As mentioned above, the process of the present invention includes heat treatment while irradiating ultraviolet light in an atmosphere containing nitrogen oxide or nitrogen hydride after the gate electrode is formed. The heat treatment neutralizes and extinguishes recombination centers in a non-single crystal semiconductor, and this greatly improves the characteristics of non-single crystalline TFTs. Although the effect in Examples 1 and 2 is explained with an emphasis on the reduction of leakage current, the process of the present invention produces TFTs which are comparable to those made from single crystalline silicon in field effect mobility, S value, threshold voltage and the like.

The process of the present invention can be applied to not only a TFT but also any other semiconductor devices having the insulated gate structure (such as capacitor and other elements of insulated gate structure and integrated circuits). Therefore, the present invention is of great industrial use.

What is claimed is:

1. A method for producing a semiconductor device comprising the steps of:

forming a top gate type thin film transistor, wherein at least a portion of a channel forming region adjacent to a gate insulating film is a semiconductor; and irradiating the top gate type thin film transistor with ultraviolet light having a wavelength of 350 nm or less in an atmosphere including a nitrogen oxide while heating treatment is performed at 300° C. or higher.

2. The method of claim 1 wherein the semiconductor is non-single crystalline.

3. The method of claim 1 wherein the semiconductor is single crystalline.

4. The method of claim 1 wherein the nitrogen oxide includes one of $N_2O$, $NO$, $NO_2$ and $NO_x$ ($0.5<x<2$).

5. The method of claim 1 wherein the top gate type thin film transistor has a gate electrode formed over the channel forming region.

6. The method of claim 1 wherein the atmosphere further includes nitrogen hydride.

7. The method of claim 1 wherein the heating treatment is performed at 600° C. or lower.

8. A method for producing a semiconductor device comprising the steps of:

forming a top gate type thin film transistor, wherein at least a portion of a channel forming region adjacent to a gate insulating film is a semiconductor; and irradiating the top gate type thin film transistor with ultraviolet light having a wavelength of 350 nm or less in an atmosphere including a nitrogen hydride while heating treatment is performed at 300° C. or higher.

9. The method of claim 8 wherein the semiconductor is non-single crystalline.

10. The method of claim 8 wherein the semiconductor is single crystalline.

11. The method of claim 8 wherein the heating treatment is performed at 600° C. or lower.

12. The method of claim 8 wherein the nitrogen hydride includes one of $NH_3$, $N_2H_4$, and $NH_x$ ($1<x<3$).

13. The method of claim 8 wherein the top gate type thin film transistor has a gate electrode formed over the channel forming region.

14. A method for producing a semiconductor device comprising the steps of:

forming a semiconductor film on a substrate having an insulating surface;

forming a gate electrode on the semiconductor film through a gate insulating film;

introducing an impurity into the semiconductor film using the gate electrode as a mask; and irradiating the semiconductor film with ultraviolet light having a wavelength of 350 nm or less in an atmosphere including nitrogen oxide while heating treatment is performed at 300° C. or higher.

15. The method of claim 14 wherein the semiconductor film is non-single crystalline.

16. The method of claim 14 wherein the semiconductor film is single crystalline.

17. The method of claim 14 wherein the heating treatment is performed at 600° C. or lower.

18. The method of claim 14 wherein the nitrogen oxide includes one of $N_2O$, $NO$, $NO_2$ and $NO_x$ ($0.5<x<2$).

19. The method of claim 14 wherein the atmosphere further includes nitrogen hydride.

20. The method of claim 19 wherein the nitrogen hydride includes one of $NH_3$, $N_2H_4$, and $NH_x$ ($1<x<3$).

21. A method for producing a semiconductor device comprising the steps of:

forming a semiconductor film on a substrate having an insulating surface;

forming a gate electrode on the semiconductor film through a gate insulating film;

introducing an impurity into the semiconductor film using the gate electrode as a mask; and irradiating the semiconductor film with ultraviolet light having a wavelength of 350 nm or less in an atmosphere including nitrogen hydride while heating treatment is performed at 300° C. or higher.

22. The method of claim 21 wherein the semiconductor film is non-single crystalline.

23. The method of claim 21 wherein the semiconductor film is single crystalline.

24. The method of claim 21 wherein the heating treatment is performed at 600° C. or lower.

25. A method for producing a thin film transistor comprising the steps of:

forming an amorphous silicon film on a substrate having an insulating surface;

crystallizing the amorphous silicon film;

forming a gate electrode on the crystallized silicon film through a gate insulating film;

introducing an impurity into the crystallized silicon film using the gate electrode as a mask; and performing heating treatment in an atmosphere including nitrogen oxide while ultraviolet light is irradiated.

26. A method for producing a thin film transistor comprising the steps of:

forming a silicon film on a substrate having an insulating surface;

crystallizing the silicon film;

forming a gate electrode on the crystallized silicon film through a gate insulating film;

introducing an impurity into the crystallized silicon film using the gate electrode as a mask; and performing heating treatment in an atmosphere including nitrogen hydride while ultraviolet light is irradiated.

27. The method of claim 26 wherein the silicon film is non-single crystalline.

28. The method of claim 26 wherein the nitrogen oxide includes one of $N_2O$, $NO$, $NO_2$ and $NO_x$ ($0.5<x<2$).

29. The method of claim 26 wherein the atmosphere further includes nitrogen hydride.

30. The method of claim 29 wherein the nitrogen hydride includes one of $NH_3$, $N_2H_4$, and $NHx$ ($1<x<3$).

* * * * *